(12) United States Patent
Meier et al.

(10) Patent No.: US 11,915,737 B2
(45) Date of Patent: Feb. 27, 2024

(54) APPARATUS WITH REFRESH MANAGEMENT MECHANISM

(71) Applicant: Lodestar Licensing Group LLC, Evanston, IL (US)

(72) Inventors: Nathaniel J. Meier, Boise, ID (US); James S. Rehmeyer, Boise, ID (US); David R. Brown, Allen, TX (US)

( * ) Notice: Subject to any disclaimer, the term of this patent is extended or adjusted under 35 U.S.C. 154(b) by 0 days.

(21) Appl. No.: 17/882,894

(22) Filed: Aug. 8, 2022

(65) Prior Publication Data
US 2022/0375509 A1 Nov. 24, 2022

Related U.S. Application Data

(63) Continuation of application No. 17/091,969, filed on Nov. 6, 2020, now Pat. No. 11,410,715.

(51) Int. Cl.
*G11C 11/00* (2006.01)
*G11C 11/406* (2006.01)
(Continued)

(52) U.S. Cl.
CPC ...... *G11C 11/40611* (2013.01); *G06F 3/0604* (2013.01); *G06F 3/0659* (2013.01);
(Continued)

(58) Field of Classification Search
CPC ............. G11C 11/40611; G11C 11/406; G11C 11/40622; G11C 11/408; G11C 11/40618; G11C 11/40603; G11C 11/4091; G11C 11/40615; G11C 11/4074; G11C 11/4078; G11C 11/4085; G11C 15/043; G11C 29/42; G11C 29/44; G11C 11/1655; G11C 11/1657; G11C 11/4076; G11C 11/4082; G11C 11/4087; G11C 11/4094; G11C 11/4096; G11C 11/419; G11C 15/04; G11C 16/28; G11C 16/3431; G11C 16/349; G11C 2029/0409; G11C 2029/0411; G11C 2029/1202; G11C 2211/406; G11C 2211/4062; G11C 2211/4065;
(Continued)

(56) References Cited

U.S. PATENT DOCUMENTS 9,087,554 B1 7/2015 Park
9,236,110 B2 * 1/2016 Bains .................... G06F 3/0619
(Continued)

OTHER PUBLICATIONS

International Application No. PCT/US2021/052744—International Search Report and Written Opinion, dated Jan. 17, 2022, 12 pages.

*Primary Examiner* — Thong Q Le
(74) *Attorney, Agent, or Firm* — Holland & Hart LLP

(57) ABSTRACT

Methods, apparatuses, and systems related to managing operations performed in response to refresh management (RFM) commands A controller generates the RFM command for coordinating a refresh management operation targeted for implementation at an apparatus. The apparatus tracks refresh target set that includes refresh management target locations within the apparatus. According to the tracked refresh management target set, the apparatus selectively implements the targeted refresh management operation and/or a response operation in addition to or as a replacement for the targeted refresh management operation.

19 Claims, 9 Drawing Sheets

(51) Int. Cl.
  *G06F 3/06*   (2006.01)
  *G11C 29/52*  (2006.01)
  *H01L 25/065*  (2023.01)

(52) U.S. Cl.
  CPC ...... *G06F 3/0673* (2013.01); *G11C 11/40615* (2013.01); *G11C 11/40618* (2013.01); *G11C 29/52* (2013.01); *G11C 2211/4061* (2013.01); *G11C 2211/4062* (2013.01); *H01L 25/0655* (2013.01)

(58) Field of Classification Search
  CPC .. G11C 29/52; G11C 7/00; G11C 7/02; G11C 7/1039; G11C 7/1063; G11C 7/1078; G11C 7/1093; G11C 7/222; G06F 2212/7211; G06F 3/0619; G06F 3/0659; G06F 3/0673; G06F 2201/88; G06F 7/584; G06F 11/1004; G06F 11/1048; G06F 11/106; G06F 11/1443; G06F 11/3037; G06F 13/1636; G06F 21/79; G06F 2201/805; G06F 2201/81; H03K 3/84
  See application file for complete search history.

(56) References Cited

U.S. PATENT DOCUMENTS

| | | |
|---|---|---|
| 2018/0004415 A1 | 1/2018 | Lee et al. |
| 2018/0190340 A1 | 7/2018 | Kim et al. |
| 2019/0073161 A1 | 3/2019 | Nale |
| 2019/0122722 A1 | 4/2019 | Yamada et al. |
| 2019/0228813 A1 | 7/2019 | Nale et al. |
| 2020/0111525 A1 | 4/2020 | Cowles et al. |
| 2020/0211633 A1 | 7/2020 | Okuma |

\* cited by examiner

APPARATUS WITH REFRESH MANAGEMENT MECHANISM

CROSS-REFERENCE TO RELATED APPLICATION(S)

This application is a continuation of U.S. patent application Ser. No. 17/091,969, filed Nov. 6, 2020, which is incorporated herein by reference in its entirety.

TECHNICAL FIELD

The disclosed embodiments relate to devices, and, in particular, to semiconductor memory devices with a refresh management mechanism.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

With technological advancements in other areas and increasing applications, the market is continuously looking for faster, more efficient, and smaller devices. To meet the market demand, the semiconductor devices are being pushed to the limit. In doing so, some circuits offload or share processing burdens with other circuits. For example, memory controllers and memory devices may share different amounts of the processing burdens for internal operations, such as refresh operations. However, shifting the processing burden from one circuit to another may create additional sources of error and/or cause inefficiencies.

DETAILED DESCRIPTION

Figure 1A:
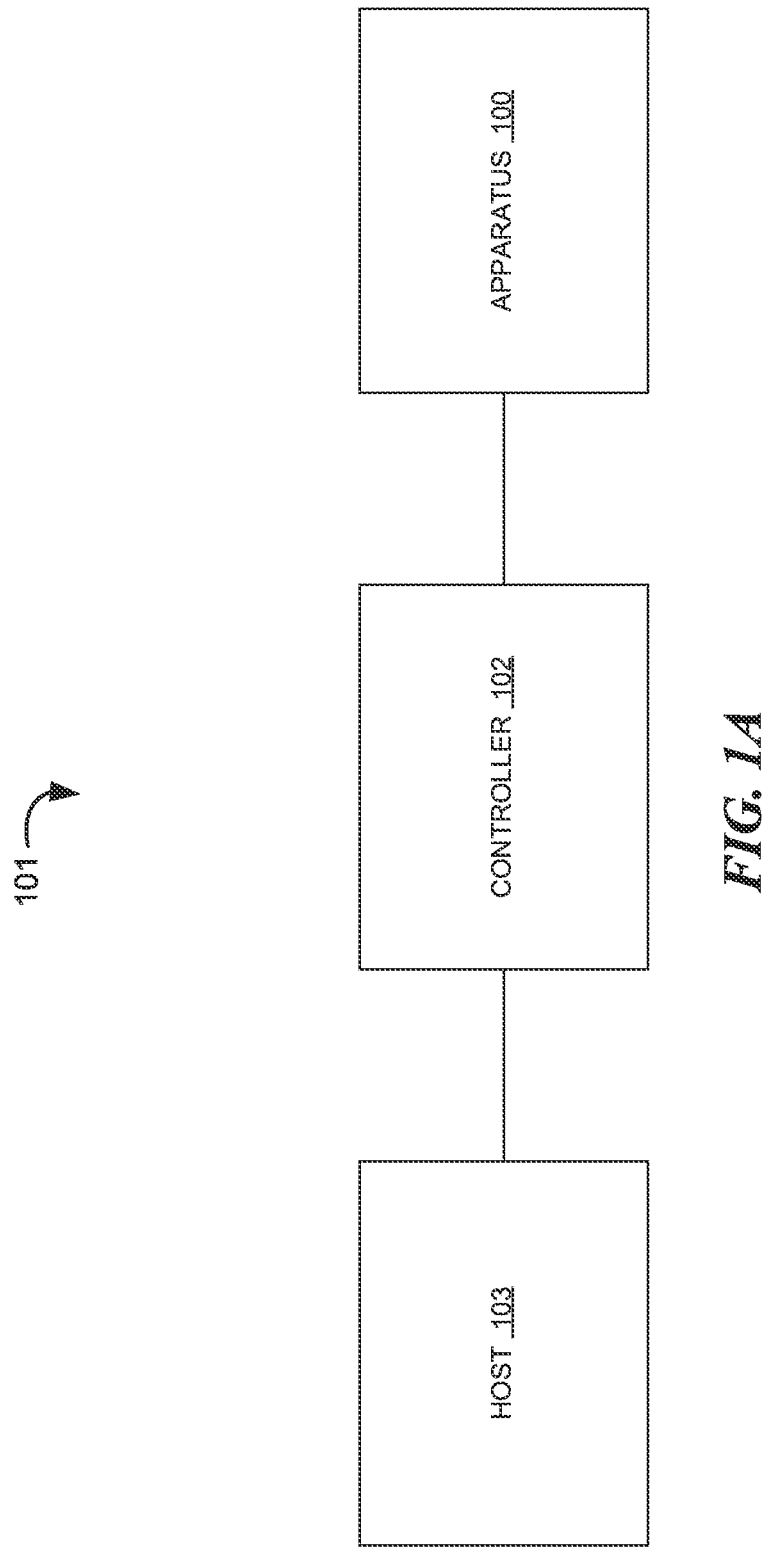
FIG. 1A is a block diagram of an example environment in which an apparatus may operate in accordance with an embodiment of the present technology.

As described in greater detail below, the technology disclosed herein relates to an apparatus, such as memory systems, systems with memory devices, related methods, etc., for managing memory-internal operations, such as refresh operations (e.g., refresh management (RFM) operations). As described detail below, an apparatus (e.g., a memory system/device, such as a DRAM) can balance implementations of externally-commanded refresh management (RFM) operations for any usage-based and/or internally-tracked necessary refresh operations.

As memory devices become smaller and faster, storage circuits can experience data degradation due to the adverse effects of repeated access, such as for repeated reads from and/or repeated writes to the same address or addresses within a region. As an illustrated example, for one specific type of memory degradation, stored charge can be lost in the cells of a word line when an adjacent or nearby word line is repeatedly activated/deactivated over a short period of time. The potential for adverse cell disturb effects is further worsened for physically smaller memory devices, in which the distance between adjacent word lines decreases, and cell capacitance drops. To offset the potential for charge loss, the memory devices can perform operations to refresh (e.g., compensate for the loss by recharging) the word lines that are adjacent to a heavily activated word line.

Conventional devices have implemented the refresh management between or in parallel with commanded operations, such as by "stealing" one or more operating cycles. However, the time window for performing the internal refresh management is further decreasing as the memory devices and/or the hosts become faster. For example, DRAM devices are synchronous and perform commanded operations in real-time. In other words, the DRAM devices must write, read, and refresh data at the host's command. As such, as the overall operating speeds increase, the time used to perform the internal refresh management operations is decreasing at the same rate. Further, occurrences of pathological patterns or usage (e.g., repetitive access to same address or region) that require/trigger the memory-internal operations are increasing in frequency with the growth of technology. Thus, the memory-internal operations need to be executed more frequently, thereby increasing the risk of failure and/or increasing the errors/issues associated with back-to-back internal operations.

In some embodiments, a memory controller may be configured to track activation events and send corresponding commands. For example, DDR5 may require the memory controller to track the commands and/or addresses to detect potential degradation or disturb events. In response, the memory controller can generate and send the RFM command to the memory device (e.g., DDR5 DRAM). The RFM command can be configured to cause the memory device to perform a cell disturb mitigation operation to remedy the adverse effects of specific heavily concentrated activation (e.g., threshold number of activation) events to a threshold number of rows. The memory controller can create or adjust a schedule or a timing of operations subsequent to the RFM command to facilitate the necessary mitigation events.

Some embodiments of the apparatus (e.g., the memory device, such as the DRAM) may separately include circuitry therein to internally track and manage disturb risks. As such, in some situations, the memory controller may unknowingly trigger an internal commands to address an disturb event that has been or is scheduled to be addressed internally by the memory device. In other words, the memory device can be configured to address one or more disturb events via the internal circuitry without the RFM command. Accordingly, the received RFM command may be duplicative and unnecessary.

As described in detail below, embodiments of the present technology can include circuits/functions to (1) to internally track and manage disturb events and (2) manage the time scheduled for disturb mitigation associated with the RFM commands Embodiments of the present technology can include a circuit configured to determine whether the cell disturb event associated with the RFM command has been addressed or is scheduled to be addressed within a threshold duration. Accordingly, the circuit can use a time window associated with the RFM command to implement an disturb mitigation operation, adjust schedules of upcoming internally-initiated disturb mitigation operations, and/or implement an operation different from adjacent row activation and disturb mitigation (e.g., issue a different memory maintenance operation).

FIG. 1A is a block diagram of an example environment 101 in which an apparatus 100 may operate in accordance with an embodiment of the present technology. The example environment 101 can correspond to a computing device or system. As described in detail below, the apparatus 100 can include a memory device or system, such as a volatile memory, a non-volatile memory, or a combination device/system. For example, the apparatus 100 can include a DRAM.

The apparatus 100 can be electrically coupled to an apparatus controller 102 (e.g., a memory controller, a buffer, a repeater device, such as an RCD, etc.) and a host 103 (e.g., a set of processors). Some example operating environments can include a computing system having a central processing unit (CPU) as the host 103 interacting with a memory controller to write data to and read data from a DRAM. The host 103 can function according to an operating system and send operational communications (e.g., read/write commands, write data, addresses, etc.) to the memory controller. The apparatus 100 can also send read data back to the system controller 104 as the operational communications. The apparatus controller 102 can manage the flow of the data to or from the apparatus 100 according to the address and/or the operation.

Figure 1B:
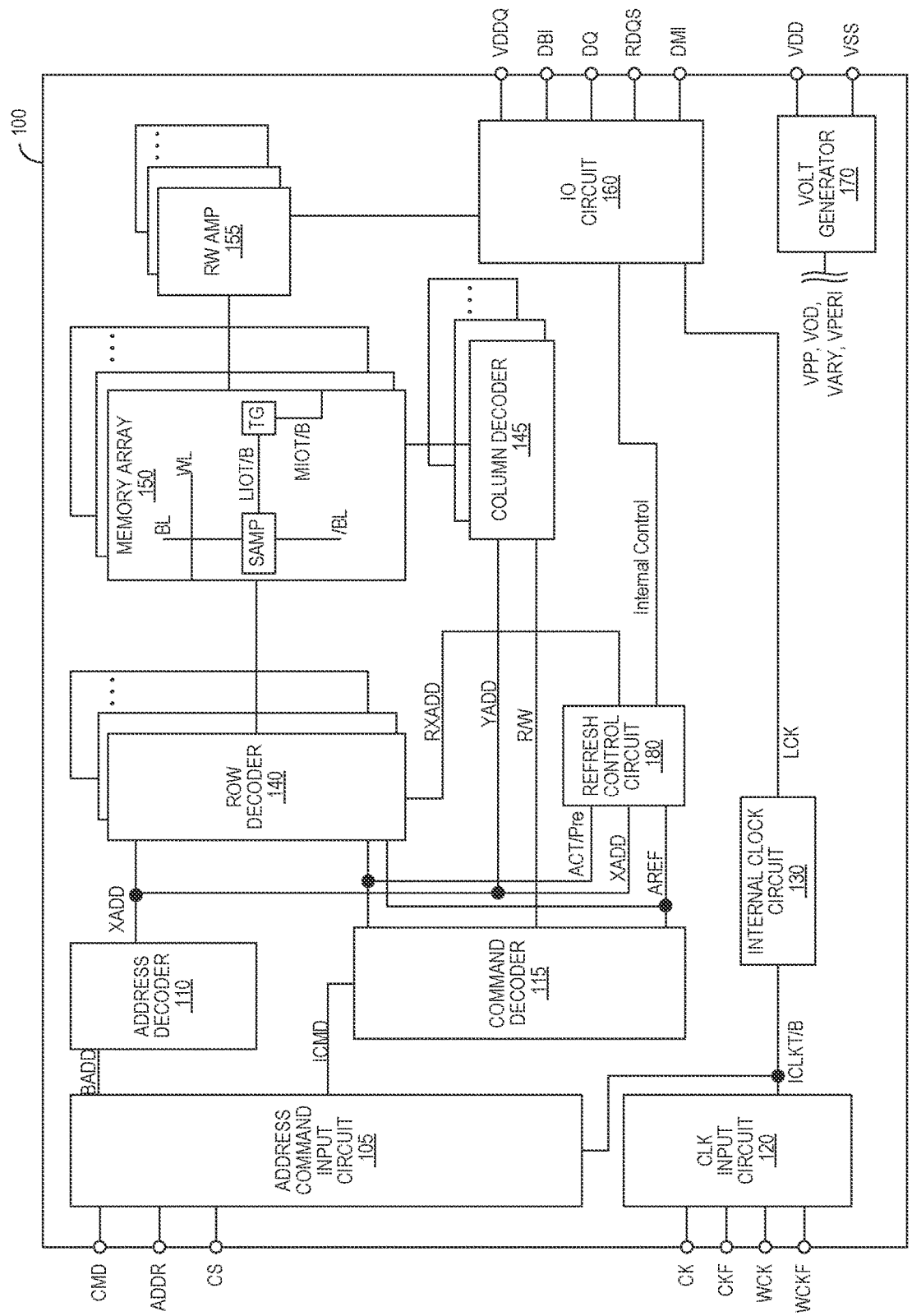
FIG. 1B is a block diagram of an apparatus in accordance with an embodiment of the present technology.

FIG. 1B is a block diagram of the apparatus 100 (e.g., a semiconductor die assembly, including a 3DI device or a die-stacked package) in accordance with an embodiment of the present technology. For example, the apparatus 100 can include a DRAM (e.g., DDR4 DRAM, DDR5 DRAM, LP DRAM, HBM DRAM, etc.), or a portion thereof that includes one or more dies/chips. In some embodiments, the apparatus 100 can include synchronous DRAM (SDRAM) of DDR type integrated on a single semiconductor chip.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1B) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller (e.g., the apparatus controller 102 of FIG. 1A). The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1B). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register (not shown in FIG. 1B). The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1B) from the command/address input circuit 105. For example, the internal clock circuit 130 can include a clock path (not shown in FIG. 1B) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The apparatus 100 can be connected to any one of a number of electronic devices capable of utilizing memory for the temporary or persistent storage of information, or a component thereof. For example, a host device (e.g., the host 103 of FIG. 1A) of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100, although in other embodiments, the host device may be indirectly connected to memory device (e.g., over a networked connection or through intermediary devices).

The apparatus 100 can include a refresh control circuit 180 configured to control refreshing of the information of the corresponding memory cell MC. For example, as inputs, the refresh control circuit 180 can receive the decoded row address signal (XADD) from the address decoder 110, a refresh signal (AREF) from the command decoder 115, an active signal (ACT) and/or a precharge signal (Pre) from the command decoder 115, etc. The command decoder 115 can generate the active signal (ACT) (e.g., a pulse signal) when the command signals (CMD) indicates row access (e.g., active command) The command decoder 115 can generate the precharge signal (Pre) (e.g., a pulse signal) when the command signal (CMD) indicates pre-charge. The command decoder 115 can generate the refresh signal (AREF) (e.g., a pulse signal) when the command signal (CMD) indicates an auto-refresh command and/or a self-refresh entry command In response to the self-refresh entry command, the refresh signal (AREF) can be activated cyclically at a desired interval until a self-refresh exit command is received. In some embodiments, in response to the refresh signal (AREF), the refresh control circuit 180 can generate a refresh row address (RXADD) to the row decoder 140, which initiates the refresh operation therein (e.g., by activating a predetermined word line in the memory cell array. Accordingly, the apparatus 100 can implement a refresh operation (e.g., scheduled refreshes) to refresh (e.g., increase stored charges) targeted locations.

In some embodiments, the refresh control circuit 180 can include a detection circuit configured to control the refresh management operation. The detection circuit can be configured to detect activity based disturb events and control and/or schedule the refresh management operation and refresh word lines that are adjacent to disturbed word lines (e.g., accessed more than a threshold amount of times over a predetermined period since the last refresh operation). For implementing the refresh management, the refresh control circuit 180 can generate one or more addresses that identify victim or aggressor row(s) (e.g., the row(s) adjacent to or within a distance from the heavily activated or aggressor row).

The refresh control circuit 180 (e.g., the detection circuit) can include counters that track row access and logic configured to compare the access count to a predetermined limit. When the access count reaches the limit, the refresh control circuit 180 (e.g., the detection circuit and/or other circuits within the refresh control circuit 180) can identify the corresponding row as the targeted/accessed row and adjacent row(s) as the disturbed row(s). Based on identifying the victim row(s), the refresh control circuit 180 can generate the address(es) of the victim row(s) as the refresh management address.

The refresh control circuit 180 can provide a refresh address (e.g., the refresh management address) to a decoder (e.g., the row decoder 140) for executing the memory-internal operation. The refresh control circuit 180 can also provide internal controls to a scheduling circuit based on detecting the predetermined conditions. The scheduling circuit can be integral with the refresh control circuit 180 and/or included in other circuits, such as the input/output circuit 160. The scheduling circuit can be configured to generate the scheduling outputs based on the internal controls.

As described in detail below, the refresh control circuit 180 and/or the scheduling circuit can be configured to determine whether the disturb event associated with the RFM command has been addressed or is scheduled to be addressed within a threshold duration. The circuit can use a time window associated with the RFM command to implement an appropriate disturb mitigation operation, adjust schedules of upcoming internally-initiated disturb mitigation operations, and/or implement an operation different from adjacent row disturb mitigation (e.g., a different memory maintenance operation).

Figure 2A:
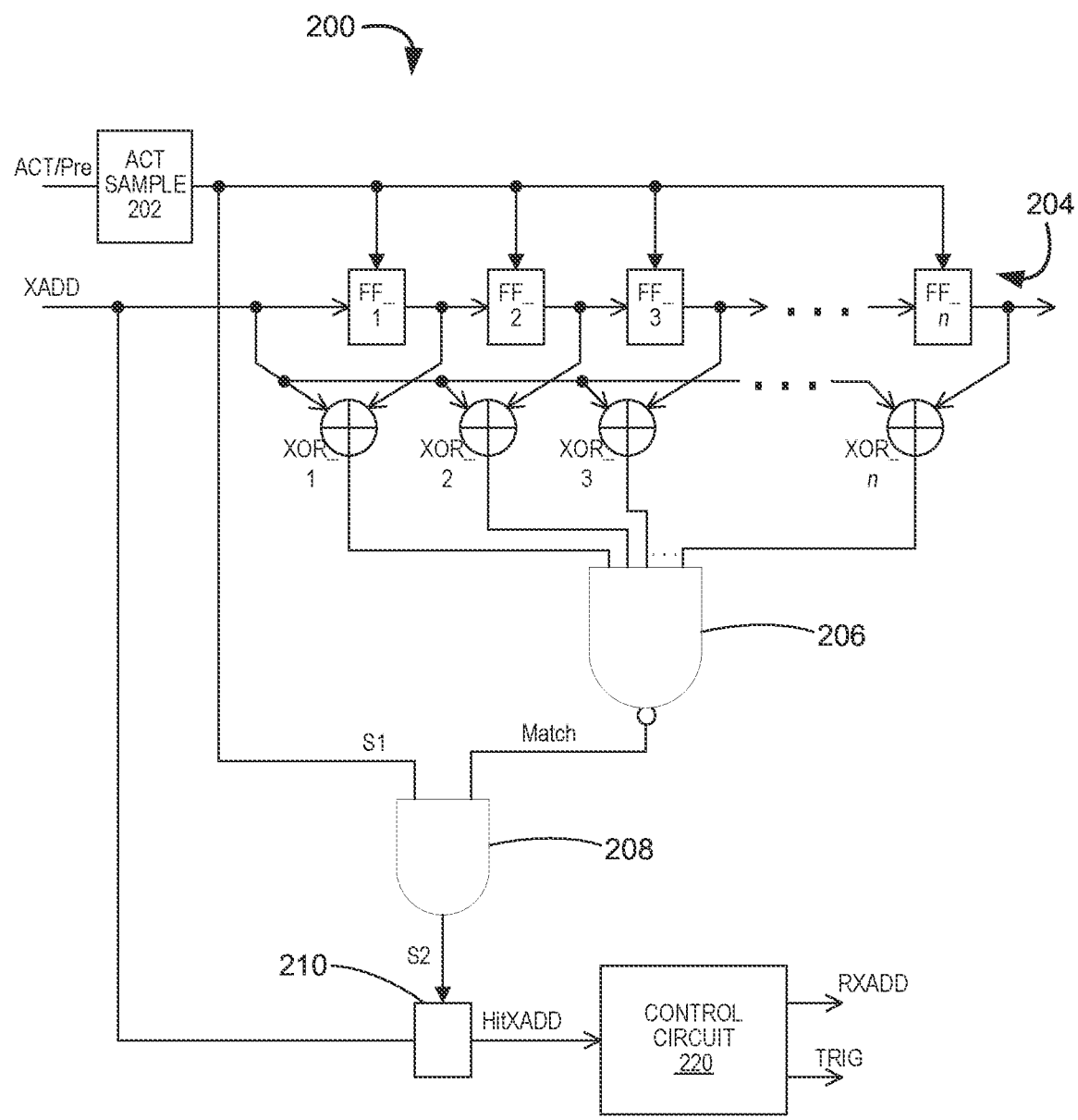
FIG. 2A is a block diagram of a row disruption detection circuit in accordance with an embodiment of the present technology.

FIG. 2A is a block diagram of a high activity row disturb detection circuit 200 (e.g., a portion of the refresh control circuit 180 of FIG. 1B) in accordance with an embodiment of the present technology. In some embodiments, the row disturb circuit 200 can be included in the refresh control circuit 180 and be configured to detect row disturb events. In other words, the detection circuit 200 can include circuitry that enables the apparatus 100 of FIG. 1A to detect row disturb events autonomously and without any notification of an disturb mitigation event or a related notifying/conclusory command from an external source, such as the apparatus controller 102 of FIG. 1A. The row disturb detection circuit 200 can be configured to receive a refresh signal (AREF), an active signal (ACT), a pre-charge signal (Pre), a row address XADD, etc. from other circuits, such as the address decoder 110 of FIG. 1B and/or the command decoder 115 of FIG. 1B.

In some embodiments, the row disturb detection circuit 200 can include a sampling signal generator 202 and/or a shift register 204. The sampling signal generator 202 can be configured to generate a first sampling signal (S1). The shift register 204 can be configured to implement shift operations synchronized with the first sampling signal (S1).

The sampling signal generator 202 can randomly extract the active signal (ACT) or the pre-charge signal (Pre), which is generated in response to an active command or a pre-charge command. The sampling signal generator 202 can output the signal as the first sampling signal (S1). The random extraction can be configured to control the sampling rate that optimizes the reliability of the refresh management operations. The sampling signal generator 202 can control the sampling rate based on the appearance frequency of accessed addresses, the number of stages of the shift register 204, etc.

In some embodiments, the shift register 204 can include n-stages of flip-flop circuits (FF_1 to FF_n) in cascade connection for latching the row addresses (XADD). In other words, an output node of the flip-flop circuit of a former stage can be connected to an input node of the flip-flop circuit of a subsequent stage. The first sampling signal (S1) can be commonly input to clock nodes of the flip-flop circuits. As a result, when the first sampling signal (S1) is activated, the current row address (XADD) can be latched by the flip-flop circuit FF_1 of a first stage, and the row addresses (XADD) latched by the flip-flop circuits FF_1 to FF_n−1 can be respectively shifted to the flip-flop circuits FF_2 to FF_n of next stages. The row address (XADD) latched by the flip-flop circuit FF_n, which is a last stage, can be discarded in response to activation of the first sampling signal (S1).

The row addresses (XADD) latched by the flip-flop circuits FF_1 to FF_n can be supplied to first-side input nodes of corresponding comparator circuits XOR_1 to XOR_n, respectively. The current row address (XADD) can be supplied to second-side input nodes of the comparator circuits XOR_1 to XOR_n. As a result, if the current row address (XADD) matches any of the row addresses (XADD) latched by the flip-flop circuits FF_1 to FF_n, the output of the comparator circuit XOR_1 to XOR_n thereof can be activated to a low level. Accordingly, a match signal (Match) output from a NAND 206 can be activated to a high level.

The match signal (Match) and the first sampling signal (S1) can be supplied to an AND 208. When both of the match signal (Match) and the first sampling signal (S1) are activated to the high level, a second sampling signal (S2) output from the AND 208 can be activated to the high level. More specifically, if the row address (XADD) supplied when the first sampling signal (S1) is activated within past n-times matches the row address (XADD) supplied when the first sampling signal (S1) is currently activated, the second sampling signal S2 can be activated. In other words, the access to the word lines (WL) can be intermittently monitored, and, if the access to the same word line WL is captured at least a predetermined number of time (e.g., two or more times) within a predetermined period of time, the second sampling signal (S2) can be activated.

The second sampling signal S2 can be supplied to a latch circuit 210. The latch circuit 210 can be configured to latch the current row address (XADD) in response to the second sampling signal (S2). The latch circuit 210 can output the latched result to a control circuit 220 as a row address (HitXADD) that corresponds to the word line WL having a high access frequency (e.g., the RH event). The control circuit 220 can be configured to convert the row address (HitXADD) output from the latch circuit 210 to a row address RXADD of the word line WL affected by the highly-frequent access. In other words, the row address (HitXADD) can be an aggressor address, and the row address (RXADD) can be a victim address, such as for the word line (WL) adjacent to or within a predetermined distance from the word line (WL) accessed by the aggressor address. The control circuit 220 can also be configured to generate a trigger (e.g., the internal detection flag) based on detecting the repeated-access condition.

For illustrative purposes, the row disturb detection circuit 200 is shown as detecting repeated row-accesses (e.g., high row activity row disturb events). However, it is understood that the row disturb detection circuit 200 can be configured to detect other repetitive access conditions, such as for columns, other locations, and/or other patterns.

Figure 2B:
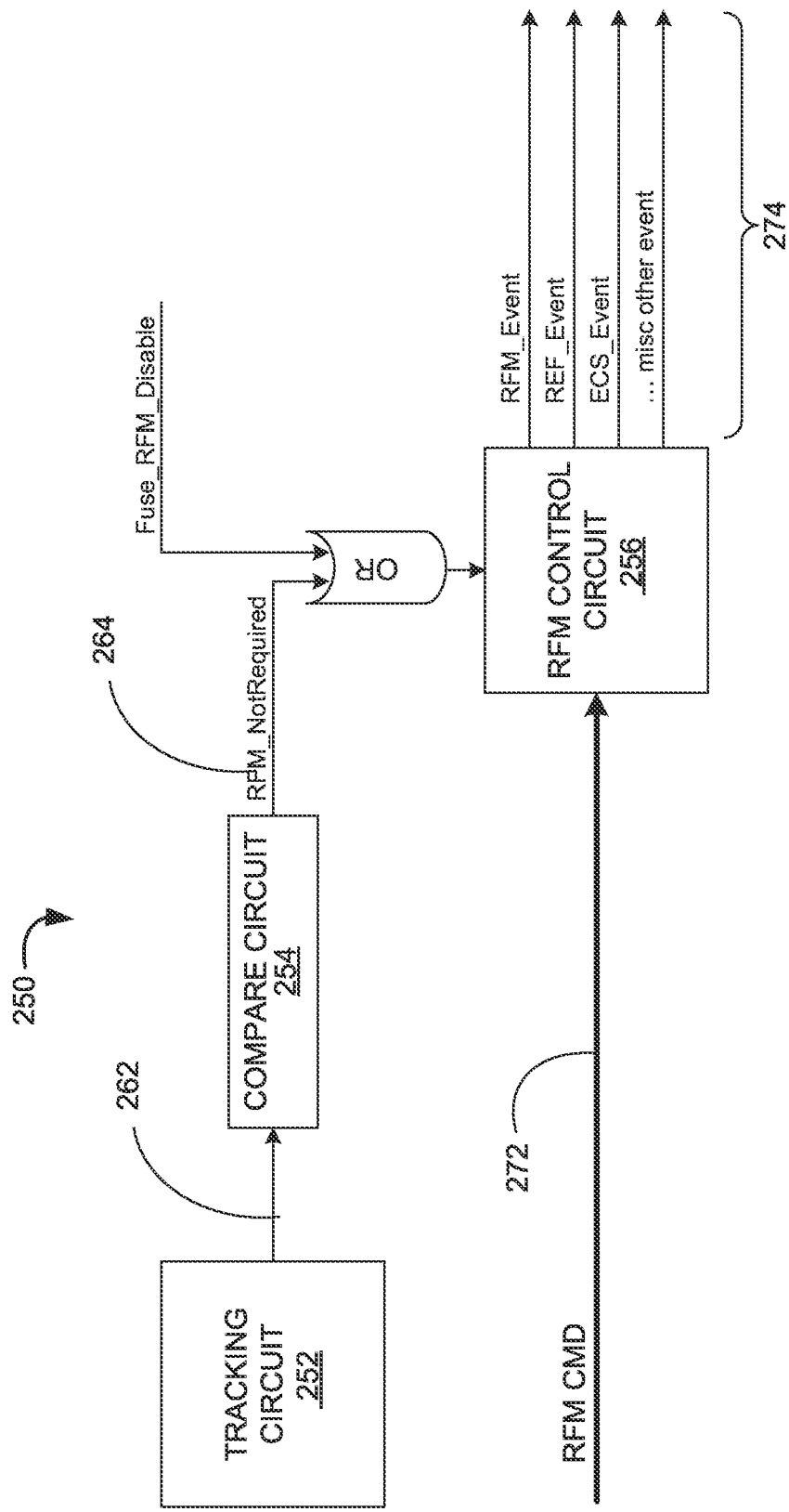
FIG. 2B is a block diagram of a refresh management circuit in accordance with an embodiment of the present technology.

FIG. 2B is a block diagram of a refresh management circuit 250 (e.g., a portion of the refresh control circuit 180 of FIG. 1B and/or a portion of the input/output circuit 160 of FIG. 1B) in accordance with an embodiment of the present technology. The refresh management circuit 250 can be configured to receive an externally-commanded refresh management (RFM) command 272 from a source external to the apparatus 100 of FIG. 1A (e.g., from the apparatus controller 102 FIG. 1A) and/or manage operations in response thereto.

In some embodiments, a computing system may be configured to track/detect cell disturb events and/or initiate associated refresh management operations by a source outside of the apparatus 100, such as using the apparatus controller 102. For example, the apparatus controller 102 can generate and send the RFM command 272 to the apparatus 100 in response to detecting an disturb event. The RFM command 272 can be configured to cause the apparatus 100 to initiate an disturb mitigation operation, such as to address the cell disturb event detected by the apparatus controller 102.

The refresh management circuit 250 can include a tracking circuit 252 configured to track refresh operations. For example, the refresh management circuit 250 can be coupled to the row disturb detection circuit 200. The tracking circuit 252 can track/store addresses (e.g., RXADD and/or the HitXADD) that have been identified internally (e.g., autonomously by the apparatus 100) for future or upcoming disturb mitigation and service. The tracking circuit 252 can remove the addresses once the corresponding location is serviced/refreshed. The tracking circuit 252 can generate a tracking output 262 that indicates an applicability or a benefit of implementing a refresh in response to the RFM command 272. In some embodiments, the tracking circuit 252 can generate the tracking output 262 as a flag that indicates whether new addresses have been logged for upcoming disturb mitigation. Additionally or alternatively, the circuit 252 can generate the tracking output 262 as a count that indicates a number of addresses tracked by the tracking circuit 252. In other words, the flag can be used to indicate whether a refresh management operation is needed (e.g., when new addresses are stored) or not (e.g., when no new addresses have been stored) according to the tracked addresses. When the refresh management operation is needed, the refresh management circuit 250 can initiate a disturb mitigation and service operation in response to the RFM command 272 as described below.

The refresh management circuit 250 can include a compare circuit 254 coupled to the tracking circuit 252. The compare circuit 254 can be configured to generate an RFM requirement signal 264 that indicates whether a refresh management operation is needed or beneficial. For example, the compare circuit 254 can include logic to generate the RFM requirement signal 264 based on the tracking output 262. When the tracking output 262 indicates that no addresses are being tracked by the tracking circuit 252, such as when all previously identified victim rows have been serviced without any subsequent detection of new cell disturb events, the compare circuit 254 can generate the RFM requirement signal 264 to indicate that the externally-initiated refresh operation (e.g., the RFM operation) is unnecessary. In other words, the compare circuit 254 can generate the RFM requirement signal 264 to ignore the RFM command 272 as a trigger for refresh operations when no victim rows have been identified by the tracking circuit 252. Otherwise, when the tracking circuit 252 includes one or more stored address (e.g., victim addresses), the compare circuit 254 can generate the RFM requirement signal 264 to indicate a validity or a benefit of implementing a refresh operation in response to the RFM command 272. In some embodiments, the refresh management circuit 250 can be configured to generate the RFM requirement signal 264 according to the system activity.

In some embodiments, the RFM requirement signal 264 can be combined with an enable/disable signal. For example, a predetermined fuse setting can be used to ignore the RFM command 272, such as for memory arrays that do not require any refresh operations and/or designs configured to rely on apparatus-internal refresh operations and ignore externally-provided RFM commands. An OR device may be used to combine the RFM requirement signal 264 with the predetermined fuse setting.

The RFM requirement signal 264 or a derivation thereof can be provided as an input an RFM control circuit 256 configured to control implementation of operations, such as by generating an operation command 274, in response to the RFM command 272. In other words, the RFM control circuit 256 can select an RFM event (RFM_Event), a refresh event (REF_Event), an error check and scrub event (ECS_Event), and/or other events (e.g., memory management operations, calibrations, background operations, etc.) according to the RFM requirement signal 264 or the derivation thereof. When the RFM event is selected, the apparatus 100 can implement a refresh operation (e.g., a disturb mitigation) in response to and/or according to the RFM command 272. The apparatus 100 can implement the refresh operation at a refresh time slot that corresponds to the RFM command 272, such as according to a predetermined delay following the reception of the RFM command 272. When the refresh event is selected, the apparatus 100 can rely on the internally-scheduled refresh events and/or ignore the RFM command 272. In some embodiments, the apparatus 100 can spread out internally-scheduled refresh operations across time. Accordingly, for the refresh event, the apparatus 100 can refresh an internally-scheduled location/address that is different from a location/address targeted by the RFM command 272.

In some embodiments, the apparatus 100 can perform other operations, such as other memory management operations. As an example, when the ECS event is selected, the apparatus 100 can check for and correct any errors (via, e.g., an on-die error correction code (ECC) engine) in the stored data. The ECS operation can be used to correct errors that may occur when a memory cell's charge has changed enough, such as due to leakage, that the charge is interpreted as a wrong logic value (i.e., the bit has "flipped" from a correct logic value, resulting in a bit "flip" error or bit error). The apparatus 100 may autonomously perform the ECS operation without receiving, from the host device 103, a command directed to performing the ECS procedure. The apparatus 100 can implement the ECS operation during the refresh time slot associated with the RFM command 272 instead of the intended refresh operation.

Figure 3:
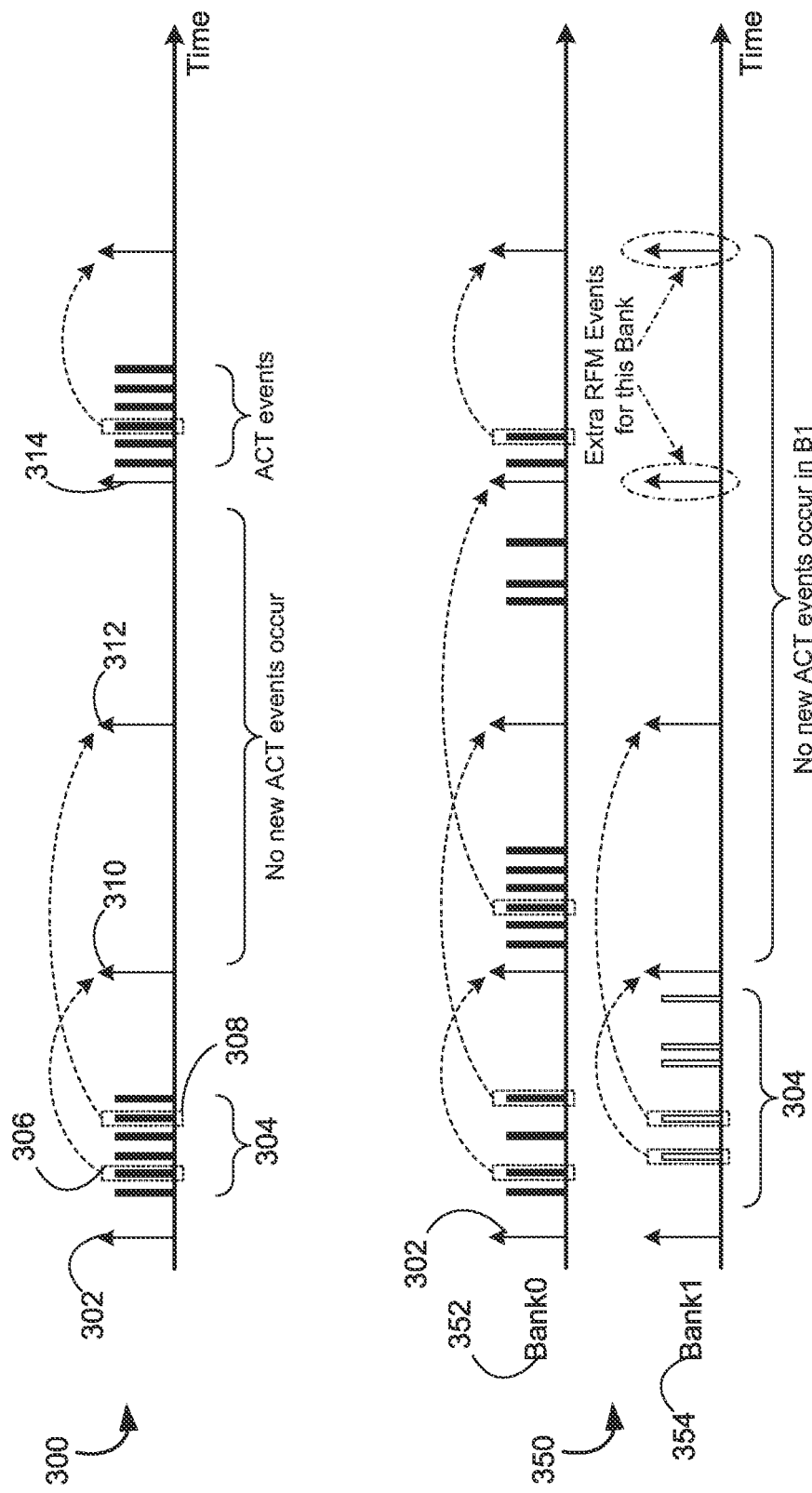
FIG. 3 illustrates timing diagrams associated with operations of the apparatus in accordance with an embodiment of the present technology.

FIG. 3 illustrates timing diagrams associated with operations of the apparatus in accordance with an embodiment of the present technology. A first diagram 300 can illustrate RFM events 302 in comparison to ACT events 304. The RFM events 302 can each correspond to (1) the apparatus 100 of FIG. 1A receiving the RFM command 272 of FIG. 2B from the apparatus controller 102 of FIG. 1A and/or (2) the designated time slot for the apparatus 100 to implement a refresh operation in response to the received command. The ACT events 304 can correspond to reception of Activate commands and corresponding operations. The ACT events 304 can correspond to activation of rows in the memory array, such as in preparation for or as part of a read/write operation. Accordingly, the ACT events 304 can be used to determine the disturb mitigation events.

In some embodiments, the apparatus controller 102 can generate and send the RFM command 272 at a fixed rate irrespective of ACT counts. While the apparatus controller 102 may regularly generate the RFM command 272 to increase protection against row activity disturb events, doing so may introduce inefficiencies. As illustrated in the first diagram 300, such inefficiencies may occur when the ACT events 304 are absent following one or more of the RFM events 302. Accordingly, the apparatus 100 (via, e.g., the refresh control circuit 180 of FIG. 1B, the scheduling circuit, the refresh management circuit 250 of FIG. 2B, and/or other circuits described above) can determine optimal use for each of the RFM events 302. For example, the apparatus 100 can schedule a reduced number of disturb mitigation operations for each row disturb event 302 and effectively spread the refresh management operations out across time/multiple RFM events 302.

As an illustrative example, the tracking circuit 252 of FIG. 2B can determine a first set of addresses 306 and a second set of addresses 308 as targets for refresh management operations after an initial RFM event. The refresh control circuit 180 can determine the sets of addresses according to a predetermined count or size. Instead of servicing both the first set 306 and the second set 308, the apparatus 100 can service the first set 306 during a first event 310 and then service the second set 308 during a second event 312. Since no ACT events 304 occurred following the first event 310, the tracking circuit 252 can be cleared of any tracked addresses when a third event 314 occurs. Accordingly, the refresh management circuit 250 can generate the operation command 274 of FIG. 2B for implementing other memory management operations, such as the ECS event, as described above. Thus, the apparatus 100 can use the time slot allotted for the third event 314 to implement other operations rather than being idle due to no refresh management operations being needed or scheduled.

In some embodiments, as illustrated in a second diagram 350, the apparatus controller 102 may have insufficient counters to track each memory bank or rank separately. As such, the apparatus controller 102 may aggregate ACT counts from multiple banks or ranks and simultaneously generate the RFM commands 272 for the banks/ranks. The simultaneously generated RFM commands 272 may generate more RFM events 302 than necessary.

As an illustrative example, the apparatus controller 102 can be configured to track the ACT events 304 for a first bank 352 (Bank0) and a second bank 354 (Bank1). However, when the first bank 352 is more active and accrues more ACT events 304 than the second bank 354, one or more RFM events 302 may be unnecessary for the second bank 354. Accordingly, the apparatus 100 can use the time slot allotted for such unnecessary events to implement other operations as described above.

Figure 4:
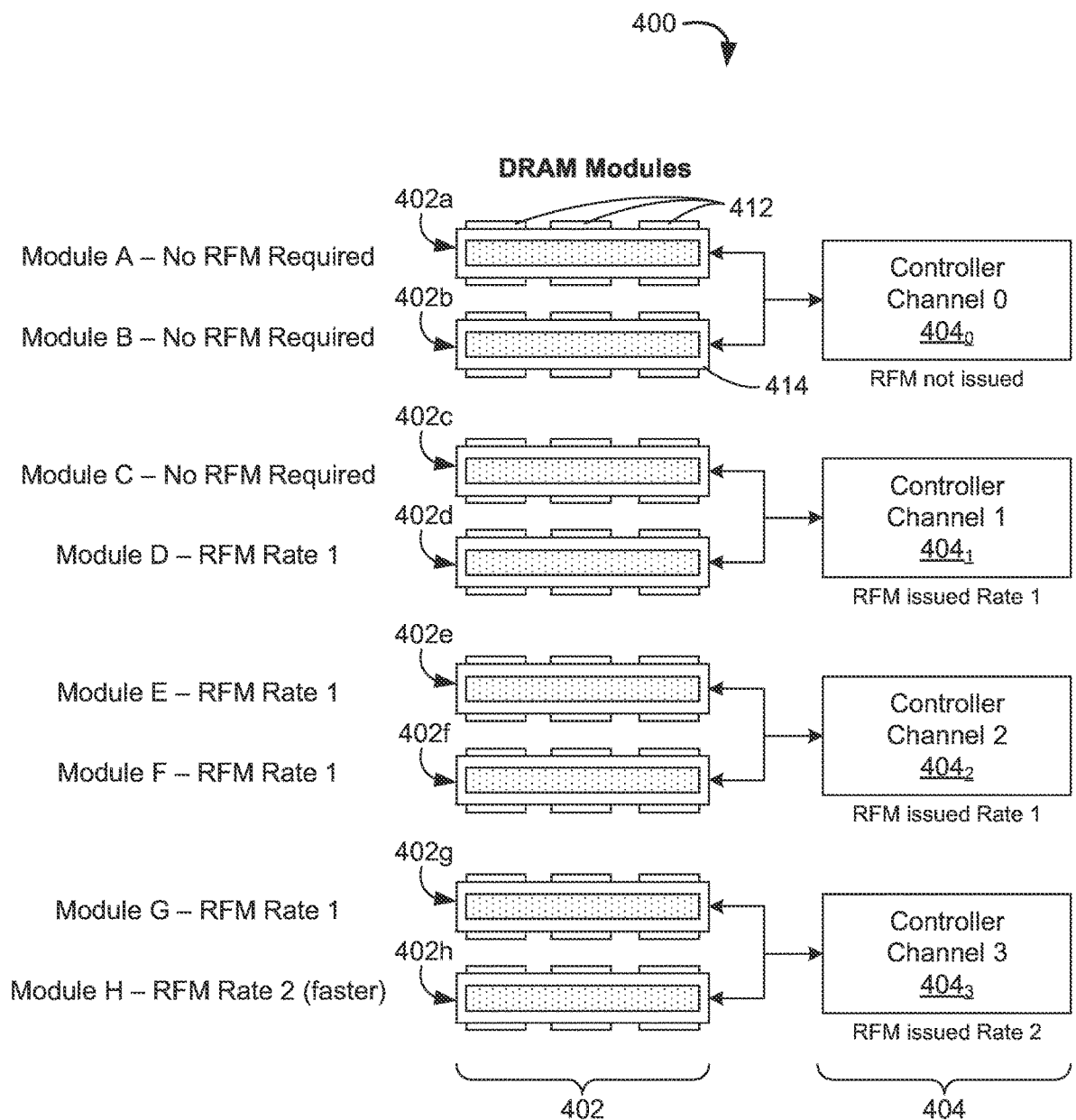
FIG. 4 illustrates another example environment in which an apparatus may operate in accordance with an embodiment of the present technology.

FIG. 4 illustrates another example environment in which an apparatus may operate in accordance with an embodiment of the present technology. The example environment can correspond to a computing system 400, such as a desktop computer, a server, a mobile device, a wearable device, an Internet of Things (IoT) device, and the like.

The computing system 400 can include a set of memory modules (e.g., DRAM modules 402) that each include one or more instances of the apparatus 100 of FIG. 1A. For example, each of the DRAM modules 402 can be a dual in-line memory module (DIMM) that includes a set of DRAM devices 412 on a substrate 414 (e.g., a printed circuit board (PCB)). The memory modules can be controlled by a set of controller channels 404 that correspond to one or more instances of the apparatus controller 102 of FIG. 1A, the host 103 of FIG. 1A, and/or independent control/processing capacities thereof. Each controller channel 404 can represent an independent control path/mechanism.

In some embodiments, the apparatus controller 102 of FIG. 1A and/or the computing system 400 may be configured to support groupings of memory ranks (e.g., memory module groupings) for each controller channel 404 instead of individually controlling each rank. In other words, the memory controller may not support separate configurations by rank, thus shared channel modules may be used. For example, each of the control channels 404 can be coupled to and/or control a set of the DRAM modules 402. For the example illustrated in FIG. 4, each of the control channels 404 can be coupled to and control a group of two DRAM modules 402. Further, each of the control channels 404 can be used to support an RFM configuration that is independent of other channels. The RFM configuration may be commonly shared or applied for the coupled group of the DRAM modules 402.

As an illustrative example, a controller channel $404_0$ can be coupled to DRAM modules 402a and 402b, a controller channel $404_1$ can be coupled to DRAM modules 402c and 402d, a controller channel $404_2$ can be coupled to DRAM modules 402e and 402f, and a controller channel $404_3$ can be coupled to DRAM modules 402g and 402h. The controller channels $404_{0-3}$ can each issue a unique RFM configuration, such as the RFM issue rate or condition as illustrated in FIG. 4.

When all of the coupled DRAM modules 402 do not require RFM operations or require the same setting, the controller channels provide a common setting. For example, the controller channel $404_0$ can be configured to not issue the RFM commands 272 since the DRAM modules 402a and 402b do not require RFM operations, such as for memories having emerging configurations that do not require RHR or for memories lacking the capacity to respond to the externally-provided RFM commands 272. Also, the controller channel $404_0$ can be configured to issue the RFM commands 272 at a rate (e.g., rate 1) that matches the RFM configuration of both the DRAM modules 402e and 402f.

When the coupled DRAM modules 402 have different RFM configurations or capacities, the corresponding controller channels can provide a default setting or a setting (e.g., RFM issue rate) that satisfies the common requirement. For example, the controller channel $404_0$ can provide a default setting to issue the RFM commands 272 when the DRAM module 402c does not require RFM operations while the DRAM module 402d supports the RFM operations. The controller channel $404_0$ can issue the RFM commands 272 according to the rate (Rate 1) supported by the DRAM module 402d. Also, the controller channel $404_0$ can provide the RFM commands 272 at the fastest supported rate (e.g., Rate 2) when the DRAM modules 402g and 402h support different RFM rates. By issuing the commands at the fastest rate, the RFM capacities of all modules can be maximized. The additional RFM commands can be ignored at the slower operating module. In some embodiments, the apparatus controller 102 can dynamically adjust the RFM rates for the controller channels 404 according to operating conditions (e.g., work load) of the coupled DRAM modules 402.

Figure 5:
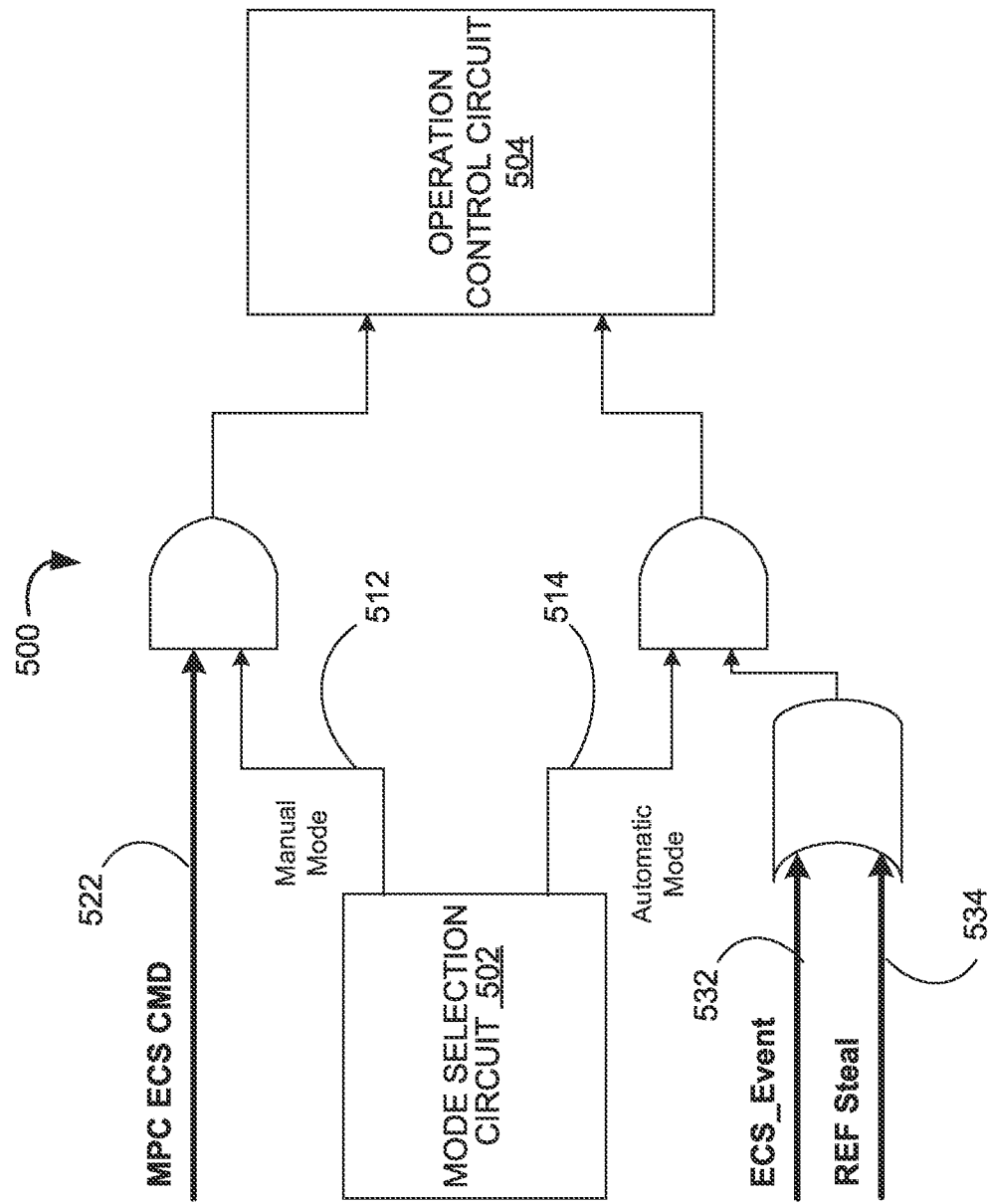
FIG. 5 is a block diagram of a replacement operation circuit in accordance with an embodiment of the present technology.

FIG. 5 is a block diagram of a replacement operation circuit 500 in accordance with an embodiment of the present technology. The replacement operation circuit 500 can be integral with or coupled to the refresh control circuit 180 of FIG. 1B. The replacement operation circuit 500 can be configured to implement a replacement operation, such as the ECS operation, in place of a refresh operation targeted by the RFM command 272.

The replacement operation circuit 500 can include a mode selection circuit 502 configured to initiate the replacement operation for a set of operational modes, such as a manual mode and an automatic mode. A manual mode can correspond to initiating the replacement operation in response to an externally-provided command 522 provided by the apparatus controller 102 of FIG. 1A and/or the host 103 of FIG. 1A. An automatic mode can correspond to the apparatus 100 of FIG. 1A initiating the replacement operation, such as according to conditional parameters and/or a frequency without input from the apparatus controller 102 and/or the host 103. Based on the setting (e.g., a predetermined selection and/or a dynamic selection), the replacement operation circuit 500 can generate either a manual mode selection 512 or an automatic mode selection 514.

In some embodiments, the generated selection signal can effectively function as an enable signal. The manual mode selection 512 and the automatic mode selection 514 can each be provided to a corresponding logic circuit (e.g., an AND device). Accordingly, the manual mode selection 512 can function as an enable for the externally-provided command 522 such that the externally-provided command 522 can be processed when the manual mode is selected or enabled.

Similarly, the automatic mode selection 514 can function as an enable for internal trigger signals, such as an ECS event signal 532 (e.g., an instance of the operation command 274 of FIG. 2B) and/or a refresh steal signal 534. The refresh steal signal 534 can represent an availability of internally-created time slots, such as "stolen" pump cycles created by managing timings of internal events (e.g., refreshes). In some embodiments, the internal trigger signals can be combined using a corresponding circuit (e.g., an OR device). For example, an OR device can be configured to generate a signal based on an active state of the ECS event signal 532 and/or the refresh steal signal 534. The generated signal can be combined with the automatic mode selection 514. Accordingly, when the automatic mode is selected/enabled, any internal trigger signals can be used to initiate the replacement operation.

According to the mode signals, the triggering signal (e.g., the externally-provided command 522, the ECS event signal 532, and/or the refresh steal signal 534) can be provided as an input to an operation control circuit 504. Based on the input, the operation control circuit 504 can be configured to implement the corresponding operation, such as the ECS event, calibration, etc. as described above. In some embodiments, the operation control circuit 504 can be implemented as a state-machine configured to implement the corresponding operation.

Figure 6:
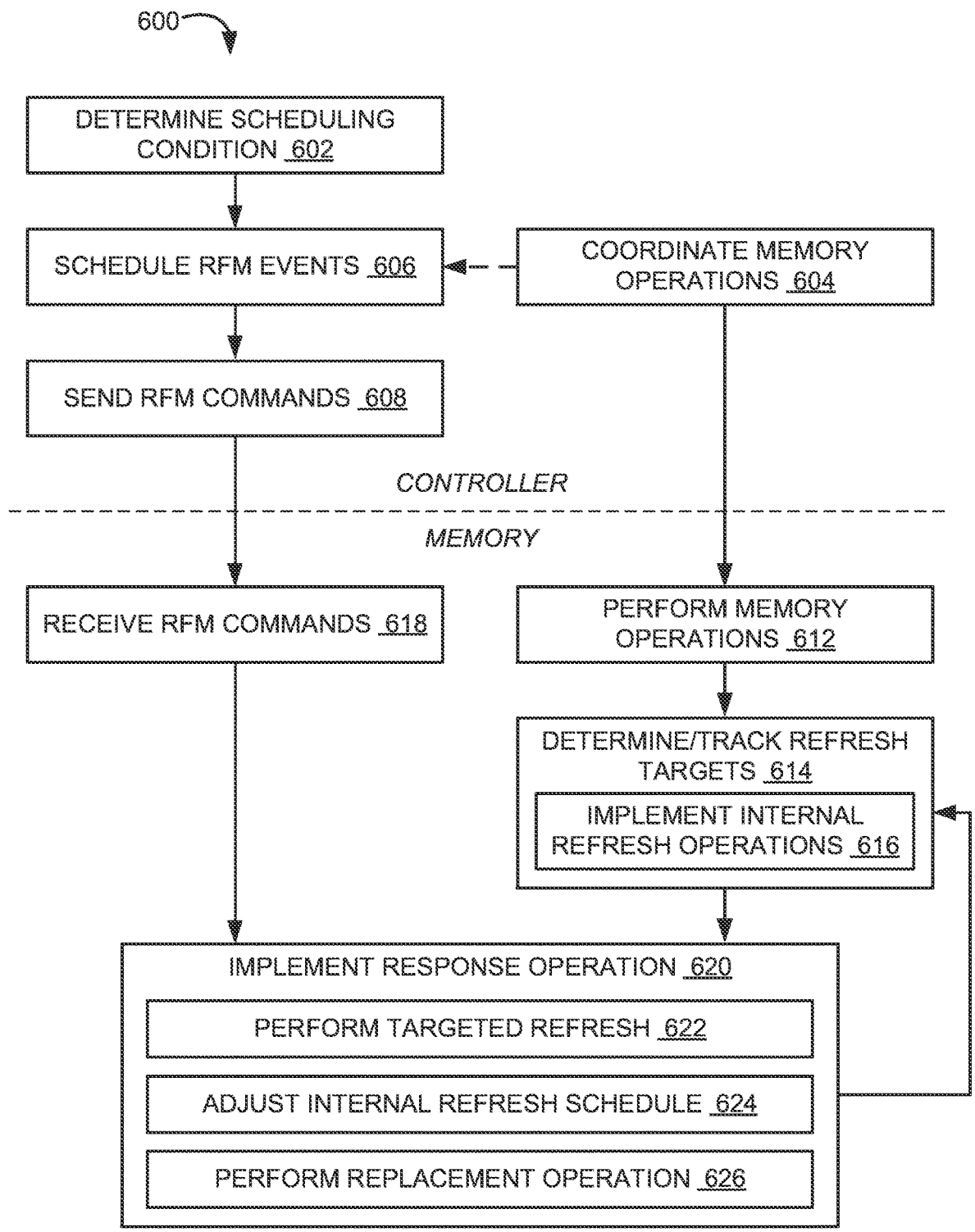
FIG. 6 is a flow diagram illustrating an example method of operating an apparatus in accordance with an embodiment of the present technology.

FIG. 6 is a flow diagram illustrating an example method 600 of operating an apparatus (e.g., the system 101 of FIG. 1A, the apparatus 100 of FIG. 1A, the refresh control circuit 180 of FIG. 1B, the scheduling circuit, the refresh management circuit 250 of FIG. 2B, and/or other circuits described above) in accordance with an embodiment of the present technology. The method 600 be for operating the apparatus 100 to manage RFM events.

At block 602, the system 101 (via, e.g., the apparatus controller 102 of FIG. 1A) can determine a scheduling condition for the RFM operations. For example, the apparatus controller 102 can determine the RFM configurations (e.g., RFM rate capacities) of the DRAM modules 402 of FIG. 4 and/or the apparatus 100 therein. The apparatus controller 102 can determine the RFM configurations for each controller channel 404 of FIG. 4. In some embodiments, the apparatus controller 102 can determine the RFM configuration individually for each apparatus and/or module coupled to each channel 404. In other embodiments, the apparatus controller 102 can determine the RFM configuration commonly across a set of memory modules/devices coupled to each controller channel 404 as described above.

At block 604, the system 101 (via, e.g., the apparatus controller 102) can coordinate memory operations, such as read and/or write operations. For example, the host 103 of FIG. 1A can generate commands for performing reads and/or writes. In response to the hots commands, the apparatus controller 102 can generate a sequence of apparatus commands, such as precharge (PRE) commands, activate (ACT) commands, read commands, write commands, etc., that implement the corresponding reads/writes.

At block 606, the system 101 can schedule RFM events for coordinating refresh operations at the apparatus 100. In some embodiments, the apparatus controller 102 can be configured to schedule the RFM events according to a predetermined rate (e.g., Rate1 or Rate2 of FIG. 4). Additionally or alternatively, the apparatus controller 102 can be configured to schedule the RFM events according to the commanded memory operations. For example, the apparatus controller 102 can be configured to track a number of one or more commands (e.g., ACT commands) issued since the preceding RFM event. The apparatus controller 102 can track the number of commands for each apparatus (DRAM), module, and/or channel. In some embodiments, the common refresh setting for the channel can be implemented as a shared counter configured to count activation (ACT) commands generated for the devices/modules coupled to the corresponding channel.

At block 608, the system 101 can send/generate the RFM commands 272 of FIG. 2B corresponding to the scheduled RFM events. The RFM commands 272 can each be configured to implement a targeted refresh operation at the apparatus 100 during a time slot as coordinated by the controller 102. The apparatus controller 102 can generate the RFM commands 272 according to the predetermined rate and/or the dynamic count described above. In some embodiments, the apparatus controller 102 can simultaneously generate the RFM commands 272 for all devices/modules coupled to the corresponding controller channel 404, such as when a value tracked by the shared counter reaches a threshold value. In other embodiments, the apparatus controller 102 can be configured to issue separate/individual RFM commands 272 to each device/module coupled the corresponding controller channel 404.

When the devices/modules coupled to a controller channel have different RFM configurations/capacities, the apparatus controller 102 can generate the RFM commands 272 according to a minimum/common requirement as described above. For example, the controller 102 can generate the RFM commands 272 according to the fastest rate supported by the coupled devices/modules. Also, the controller 102 can generate the RFM commands 272 when at least one device/module supports the RFM operation, and even when one or more of the other devices/modules are not configured to support the RFM operations.

At block 612, the apparatus 100 can perform memory operations according to the commands generated/coordinated by the apparatus controller 102 for reading data from or writing data to the memory array 150 of FIG. 1B. For example, the apparatus 100 can receive memory operation commands, such as the ACT commands, from the apparatus controller 102.

At block 614, the apparatus 100 can internally determine/track refresh targets. The apparatus 100 (via, e.g., the refresh control circuit 180 of FIG. 1B and/or the row disturb detection circuit 200 of FIG. 2B) can track a number of targeted operations (e.g., ACT operations) and/or operated locations separately from external devices. In some embodiments, the apparatus 100 can track a duration since the preceding RFM event. Based on the tracked information, the apparatus 100 can determine triggering conditions (e.g., row activation events) for refresh management operations and/or locations targeted for refresh management operations (e.g., victim rows adjacent to the accessed row). The apparatus 100 can update the refresh management target set with the targeted locations based on the received memory operation commands. The apparatus 100 can remove the targeted locations when they are serviced/refreshed. Further, the apparatus 100 can track the targeted locations relative to internal refresh management events and/or the externally-commanded RFM events. In some embodiments, the apparatus 100 can write a register with values indicative of target locations scheduled for refresh operations. Additionally or alternatively, the apparatus 100 can update one or more bits that indicate target locations scheduled for one or more refresh operations.

At block 616, the apparatus 100 can implement internal refresh operations (e.g., internally initiated row disturb mitigation operations). For example, the refresh control circuit 180 can internally detect row disturb events and associated victim rows according to the received/performed memory operation commands. The apparatus 100 can internally initiate and implement refresh management operations in response to the internally detected row disturb events. Once the targeted locations/addresses are refreshed, the tracking circuit 252 of FIG. 2B can update the tracked refresh management locations by removing the refreshed addresses.

At block 618, the apparatus 100 can receive the RFM command 272 from the apparatus controller 102. As described above, the RFM command 272 can correspond to a targeted refresh management operation coordinated by the controller to occur at an upcoming time slot. The RFM command 272 can be received independently/separately from and/or in parallel with the performed memory operations and the internally detected/initiated refresh management operations.

At block 620, the apparatus 100 can implement a response operation. The apparatus 100 can implement the response operation in response to the received the RFM command 272. The apparatus 100 can generate the operation command 274 of FIG. 2B to implement the response operation as described above. The apparatus 100 can generate the operation command 274 based on the refresh target set.

At block 622, the apparatus 100 can perform the targeted refresh as the response operation during the upcoming/coordinated time slot. For example, the apparatus 100 can generate the operation command 274 for the RFM event as described above, such as when the refresh target set includes one or more row disturb victim rows newly added subsequent to a previous RFM command. Accordingly, the apparatus 100 can implement the targeted refresh management operation as targeted by the apparatus controller 102.

Alternatively or additionally, the apparatus 100 can coordinate and implement the response operation in addition to or as a replacement for the targeted refresh management operation. For example, as illustrated at block 624, the apparatus 100 can adjust the internal refresh schedule/configuration. The apparatus 100 can generate the operation command 274 for the REF Event as described above, such as when the refresh target set includes a number of row addresses less than a threshold and/or when no new row disturb victim rows have been added subsequent to one or more preceding RFM commands. As an illustrative example, by using the RFM to perform normal refresh management operations, the number of locations refreshed during the normal refresh management operations can be reduced. Accordingly, the DRAM can spread the refresh operations out over time and reduce the corresponding peak power consumption. Also, as illustrated at block 626, the apparatus 100 can perform a replacement operation that is different than the targeted refresh management operation. The apparatus can generate the operation command 274 for a memory management operation (e.g., the ECS Event), a calibration operation, a background operation, etc. as described above. The apparatus 100 can perform the replacement operation when the no new row disturb have been added subsequent to one or more preceding RFM commands.

Figure 7:
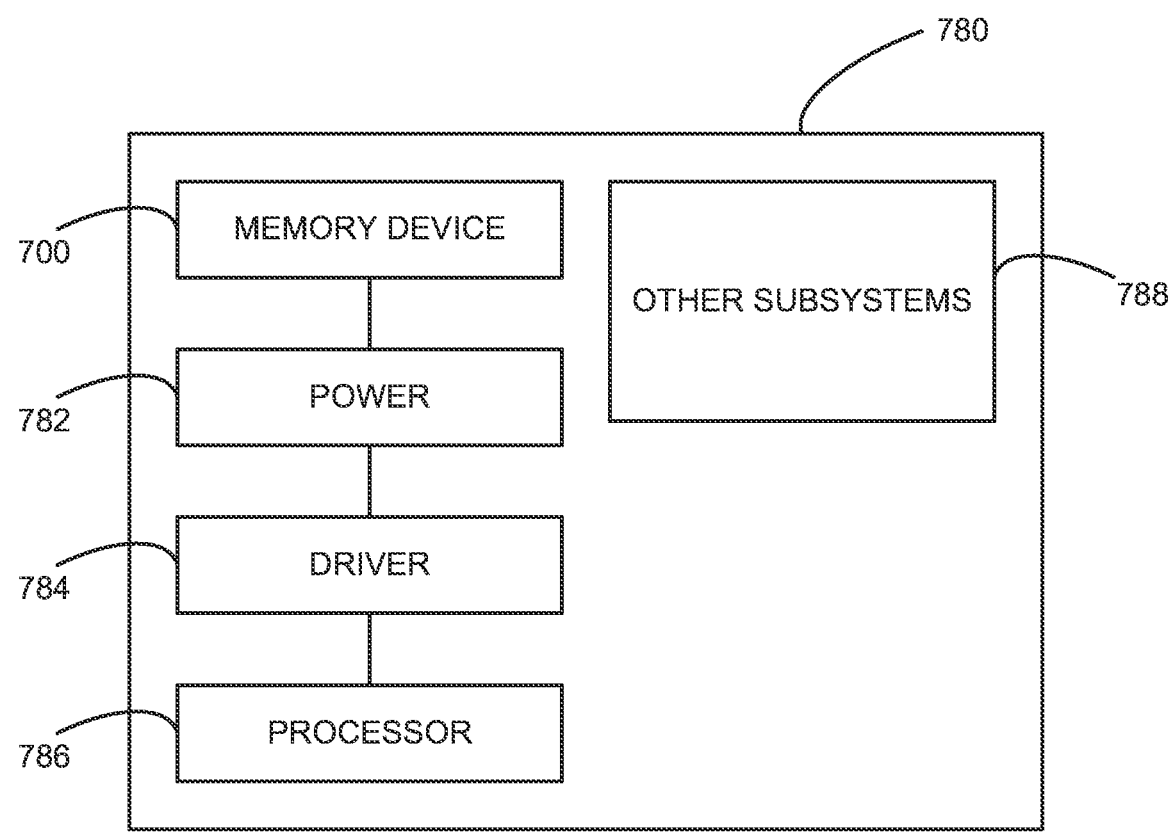
FIG. 7 is a schematic view of a system that includes an apparatus in accordance with an embodiment of the present technology.

FIG. 7 is a schematic view of a system that includes an apparatus in accordance with embodiments of the present technology. Any one of the foregoing apparatuses (e.g., memory devices) described above with reference to FIGS. 1-6 can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the apparatus described above with reference to FIGS. 1-6, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-7.

We claim:

1. An apparatus, comprising:
   a memory array;
   a refresh control circuit coupled to the memory array, the refresh control circuit configured to:
   track a set of disturbed rows to be refreshed according to received commands;
   receive from an external circuit a refresh management (RFM) command intended to initiate a refresh management operation in the memory array, wherein the refresh management operation is configured to update a charge level of at least one row within the set of disturbed rows; and
   in response to the received RFM command, generate an operation command separate from the intended refresh management.

2. The apparatus of claim 1, wherein the refresh control circuit is configured to implement the refresh management operation intended by the RFM command based on comparing the set of disturbed rows to rows refreshed during a previous RFM command.

3. The apparatus of claim 1, wherein the operation command is configured to implement a response operation separate from the refresh management operation commanded by the RFM command.

4. The apparatus of claim 3, wherein the response operation is configured to adjust scheduling of internally-scheduled refresh management operations based on (1) a number of row addresses for the set of disturbed rows, whether or not new disturbed rows have been added subsequent to a previous RFM command, or a combination thereof.

5. The apparatus of claim 4, wherein the response operation is configured to reduce a number of row addresses serviced during one or more upcoming internally-scheduled refresh management operations for redistributing the servicing of the set of disturbed rows across time.

6. The apparatus of claim 3, wherein the response operation is configured to perform an operation different from updating charges stored at the disturbed rows.

7. The apparatus of claim 6, wherein the operation includes an error check and scrub (ECS) operation that uses error correction code (ECC) information in stored data to correct the stored data.

8. The apparatus of claim 6, wherein the operation includes a calibration operation configured to adjust an operational setting that includes a read-level voltage, a programming step size, and/or a distribution target.

9. The apparatus of claim 1, wherein the apparatus comprises a Double Data Rate (DDR) Dynamic Random-Access Memory (DRAM) device.

10. A memory module, comprising:
    a first memory device configured to use a first register set to track local memory locations scheduled to be refreshed according to locally performed activation and/or memory access operations; and
    a second memory device configured to track local memory locations scheduled to be refreshed according to locally performed activation and/or memory access operations,
    wherein the first and/or the second memory devices are configured to:
    receive a refresh management (RFM) command from a separate circuit, wherein the RFM command is for initiating a refresh management operation to maintain locally stored data, wherein the refresh management operation is configured to update a charge level of at least one row within a set of disturbed rows; and
    in response to the received RFM command, generating an operation command separate from the intended refresh management operation.

11. The memory module of claim 10, wherein the memory module comprises a system that further comprises:
    a host processor;
    a second memory module; and
    wherein the separate circuit is a memory controller coupled to the host processor, the memory module, and the second memory module, the memory controller configured to utilize a controller channel to send the RFM command, wherein the controller channel (1) communicatively couples the memory module and the second memory module to the controller circuit and (2) is configured to provide a common refresh management setting for the memory module and the second memory module.

12. The system of claim 11, wherein the common refresh setting is a refresh management timing for generating the RFM commands.

13. The system of claim 12, wherein the memory controller is configured to generate the RFM commands according to the refresh management timing when the second memory module is configured to support the refresh management timing and the memory module is not configured to receive and/or process the RFM commands.

14. The system of claim 12, wherein the refresh management timing corresponds to a higher rate between (1) a first refresh management rate corresponding to the memory module and (2) a second refresh management rate corresponding to the second memory module, wherein the first and second refresh management rates correspond to a frequency for receiving and/or processing the RFM commands.

15. The system of claim 11, wherein:
- the memory controller includes a counter configured to track activation (ACT) commands generated for the memory module and the second memory module;
- the common refresh management setting is a count threshold corresponding to a value tracked by the counter; and
- the controller circuit is configured to simultaneously generate the RFM commands for the memory module and the second memory module when the value tracked by the counter reaches the count threshold.

16. A method of operating an apparatus, the method comprising:
- tracking target locations scheduled for refresh operations;
- receiving a refresh management (RFM) command from a circuit separate from a memory array, wherein the RFM command is intended to initiate a refresh management operation in the memory array, wherein the refresh management operation is configured to update a charge level of at least one row within a set of disturbed rows; and
- in response to the received RFM command, generating an operation command separate from the intended refresh management operation.

17. The method of claim 16, further comprising:
- determining that the tracked target locations include one or more disturbed rows newly added subsequent to a previous RFM command; and
- in response to the determination, implementing the intended refresh management operation instead of or in addition to the operation command.

18. The method of claim 16, further comprising:
- determining that the tracked target locations include (1) a number of addresses less than a threshold and/or (2) no new disturbed rows added subsequent to a previous RFM command; and wherein:
- the operation command is configured to implement a response operation in addition to or instead of the intended refresh management operation.

19. The method of claim 16, further comprising:
- scheduling the refresh management operation using the separate circuit, wherein the refresh management operation is scheduled according to a refresh management timing, a number of commands issued since a previous RFM command, or a combination thereof; and
- sending the RFM command to a memory device based on the scheduling.

* * * * *